United States Patent
Bermann et al.

(10) Patent No.: US 7,867,837 B2
(45) Date of Patent: Jan. 11, 2011

(54) PROCESS FOR MANUFACTURING ROUNDED POLYSILICON ELECTRODES ON SEMICONDUCTOR COMPONENTS

(75) Inventors: Franz Bermann, Lieboch (AT); Günther Koppitsch, Lieboch (AT); Sven Schroeter, Graz (AT)

(73) Assignee: Austriamicrosystems AG, Unterpremstätten (AT)

( * ) Notice: Subject to any disclaimer, the term of this patent is extended or adjusted under 35 U.S.C. 154(b) by 415 days.

(21) Appl. No.: 11/795,933

(22) PCT Filed: Jan. 13, 2006

(86) PCT No.: PCT/EP2006/000287
§ 371 (c)(1),
(2), (4) Date: Apr. 22, 2008

(87) PCT Pub. No.: WO2006/081929
PCT Pub. Date: Aug. 10, 2006

(65) Prior Publication Data
US 2009/0197407 A1    Aug. 6, 2009

(30) Foreign Application Priority Data
Feb. 1, 2005    (DE) .................... 10 2005 004 596

(51) Int. Cl.
*H01L 21/336* (2006.01)
*H01L 21/8234* (2006.01)
*H01L 21/8238* (2006.01)

(52) U.S. Cl. .............. 438/201; 438/211; 438/257; 438/706; 438/745; 257/E29.129; 257/E29.3; 257/E21.179; 257/E21.422; 257/E21.68

(58) Field of Classification Search .......... 438/201, 438/211, 257, 706, 745, FOR. 203; 257/E29.129, 257/E29.3, E21.179, E21.422, E21.68
See application file for complete search history.

(56) References Cited

U.S. PATENT DOCUMENTS

| | | | |
|---|---|---|---|
| 6,037,246 A * | 3/2000 | Bhat et al. | 438/618 |
| 6,187,676 B1 * | 2/2001 | Kim et al. | 438/656 |
| 6,699,641 B1 | 3/2004 | Hellig et al. | |
| 2002/0179960 A1 | 12/2002 | Kang et al. | |
| 2003/0049566 A1 | 3/2003 | Sabnis et al. | |
| 2004/0029354 A1 * | 2/2004 | You et al. | 438/424 |
| 2004/0077173 A1 | 4/2004 | Sivakumar | |
| 2004/0195614 A1 | 10/2004 | Chen et al. | |

* cited by examiner

*Primary Examiner*—Michelle Estrada
(74) *Attorney, Agent, or Firm*—Cohen Pontani Lieberman & Pavane LLP

(57) ABSTRACT

A polysilicon layer provided for a polysilicon electrode (8) is patterned by means of a resist mask (5) and an auxiliary layer (4) made of a material that is suitable as an antireflection layer, the auxiliary layer (4) being provided with lateral hollowed-out recesses in such a way that the polysilicon electrode is formed with rounded edges (7) during etching. The auxiliary layer is preferably produced from a soluble material and with a thickness of 70 nm to 80 nm. A base layer (2) may be provided as a gate dielectric of memory cell transistors and additionally as an etching stop layer.

4 Claims, 1 Drawing Sheet

PROCESS FOR MANUFACTURING ROUNDED POLYSILICON ELECTRODES ON SEMICONDUCTOR COMPONENTS

RELATED APPLICATIONS

This is a U.S. national stage of application No. PCT/EP2006/000287, filed on Jan. 13, 2006.

This patent application claims the priority of German patent application no. 10 2005 004 596.0 filed Feb. 1, 2005, the disclosure content of which is hereby incorporated by reference.

FIELD OF THE INVENTION

The present invention relates to a process by which optimized polysilicon structures, in particular for gate electrodes of memory cells, can be produced.

BACKGROUND OF THE INVENTION

In many semiconductor components, interconnects or electrodes made of polysilicon are patterned on a top side. For this purpose, a polysilicon layer is applied over the whole area, and subsequently patterned using a mask, in particular by means of a photoresist and photolithography. In the region of the mask openings, the polysilicon is removed by etching, which may be effected for example by means of RIE (reactive ion etching). The gate electrodes of transistor structures which are also used for memory cells of semiconductor memory components are produced in this way. EEPROM components are provided so-called floating gate electrodes, which are arranged between a control gate electrode above the channel region of the transistor and are electrically insulated all around. Charge carriers are accumulated on said floating gate electrodes during programming.

In the customary production process, such electrodes in polysilicon are produced with rather sharp, at least approximately right-angled edges. What is disadvantageous in this case is that the electric field assumes particularly high values at edges and points of conductor surfaces, with the result that conditions are present there for a breakdown and a discharge through the electrically insulating material. This fact adversely affects a multiplicity of applications of the semiconductor components. Therefore, it is desirable to have available a simple process by which the electrode structures can be formed without excessively sharp edges or corners. One possibility for achieving this is reoxidation of the polysilicon surfaces at a high oxidation temperature. However, rounded corners can be produced by this process only as long as the dimensions of the structures produced lie above a specific limit. This is because the temperatures that can be employed are limited depending on the structure width, so that in the case of very small structures, rounded edges cannot be produced by means of the oxidation steps and in fact that sharpness of the edges becomes even more greatly pronounced.

The customary mask technique for patterning semiconductor layers uses photolithography, by means of which an applied photoresist is exposed in a manner corresponding to the structures to be produced and is then developed. Depending on the type of photoresist, the exposed portions or the unexposed portions are removed after development. In order to improve the optical conditions during photolithography, an antireflection layer is provided below the photoresist. The antireflection layers are usually very thin in relation to the resist layers. One commercially available material used as BARC (bottom antireflective coating) is WIDE-15 from the company Brewer Science.

SUMMARY OF THE INVENTION

It is an object of the present invention to provide a process for producing polysilicon electrodes with sufficient rounded edges which is suitable even for very small structure dimensions.

This and other objects are attained in accordance with one aspect of the invention directed to a process for producing polysilicon electrodes on semiconductor components comprising the steps of: applying a polysilicon layer on a top side of a substrate, applying an auxiliary layer to the polysilicon layer, applying a layer made of photoresist to the auxiliary layer and patterning the photoresist layer to form a resist mask, patterning the auxiliary layer in a manner corresponding to the lateral dimensions of the resist mask, providing the auxiliary layer with lateral hollowed-out recesses and, thereafter, etching using the resist mask and the patterned auxiliary layer in order to form a polysilicon electrode having rounded edges.

In accordance with an embodiment of the invention, an auxiliary layer is applied to a polysilicon layer to be patterned, said auxiliary layer preferably being made of a material that is suitable for an antireflection layer. A resist mask is applied thereon, and the auxiliary layer is provided laterally with hollowed-out recesses, so that rounded edges are produced in a subsequent etching step for the envisaged patterning of the polysilicon layer. The etching step is effected essentially anisotropically in a direction perpendicular to the topside of the component, the resist mask shielding the etching attack. In the narrow regions of the lateral hollowed-out recesses of the auxiliary layer present below the resist mask, the upper edges of the polysilicon are also exposed to the etching attack, albeit to a smaller extent. Consequently, the polysilicon is removed at these locations to an extent such that the upper edge's of the polysilicon electrodes produced are not formed in sharp-edged or pointed fashion, but rather with roundings. This results in a significantly better operating characteristic (performance) of the components thus produced, which is manifested particularly in the case of the semiconductor memory components with floating gate electrodes as mentioned in the introduction.

The use of a soluble material as the auxiliary layer is particularly preferred. The lateral hollowed-out recesses may be produced in this case by application of a suitable solvent, which may be water, in particular. The additional process step described can be integrated into the customary production process without significant outlay, so that the process step for laterally hollowing out the auxiliary layer can be inserted without any problems after the development and patterning of the photoresist layer to form the photoresist mask.

DETAILED DESCRIPTION OF THE DRAWINGS

Figure 1:
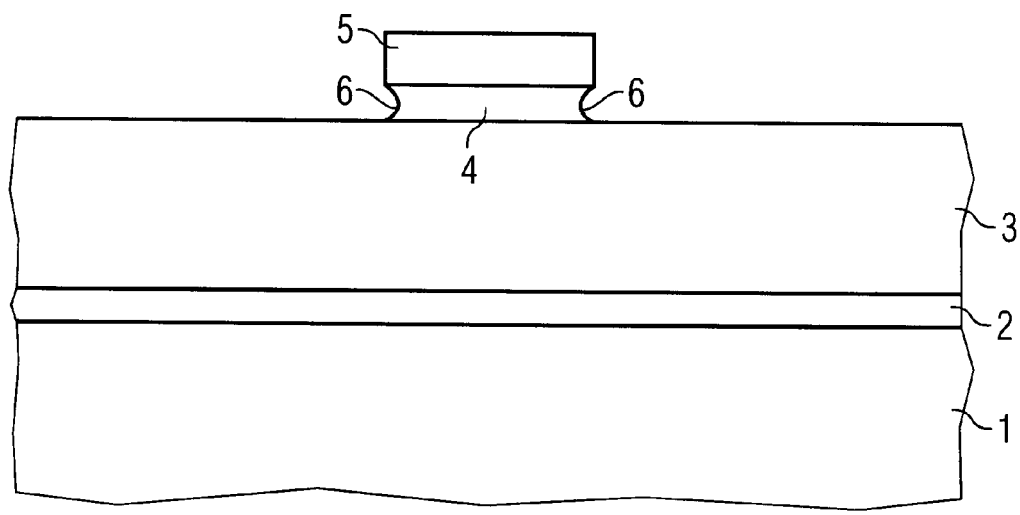
FIG. 1 shows a cross section through an intermediate product of the process after the production of the photoresist mask and the lateral hollowed-out recesses of the auxiliary layer.

FIG. 1 shows a cross section through a substrate 1, for example a semiconductor body, with a base layer 2 applied thereon and the polysilicon layer 3 to be patterned. The base layer 2 is not significant. It may be for example a dielectric layer which is provided as a gate dielectric, in particular as a gate oxide, during the production of transistor structures. It may also be one of the customary pad oxide or pad nitride layers. For the patterning of the polysilicon layer 3, there are applied on the top side the auxiliary layer 4 and a photoresist layer, which is patterned photolithographically to form the resist mask 5 depicted. The material of the auxiliary layer 4 is preferably soluble, in particular water-soluble. The lateral hollowed-out recesses 6 depicted in FIG. 1 are introduced at the sides of the auxiliary layer 4 patterned in a manner corresponding to the resist mask 5, said hollowed-out recesses being formed in the concave form illustrated particularly in the case of an auxiliary layer 4 made of a soluble material.

The auxiliary layer 4 is preferably made of a material suitable for antireflection layers in particular BARC WIDE-15 mentioned above. The auxiliary layer 4 can have a maximum thickness of 120 nm and particularly when using WIDE-15, preferably has a thickness of 70 nm to 80 nm. For the production of polysilicon electrodes for the application as floating gate electrodes, the polysilicon layer 3 typically has a thickness of 100 nm to 400 nm. The polysilicon electrode is produced in strip-type fashion for this purpose; in FIG. 1, the longitudinal direction is perpendicular to the plane of the drawing.

A typical and preferred exemplary embodiment of the production of the auxiliary layer 4 is, when using WIDE-15, a layer thickness of 110 nm, a first hotplate temperature, corresponding to an application of the auxiliary layer as an antireflection layer of 100° C. (for 60 seconds) and a second hotplate temperature of 172° C. to 178° C. (for 60 seconds). The hotplate temperature determines the solubility of the material; the higher the temperature, the lower the solubility. The development time is preferably approximately 60 seconds.

Figure 2:
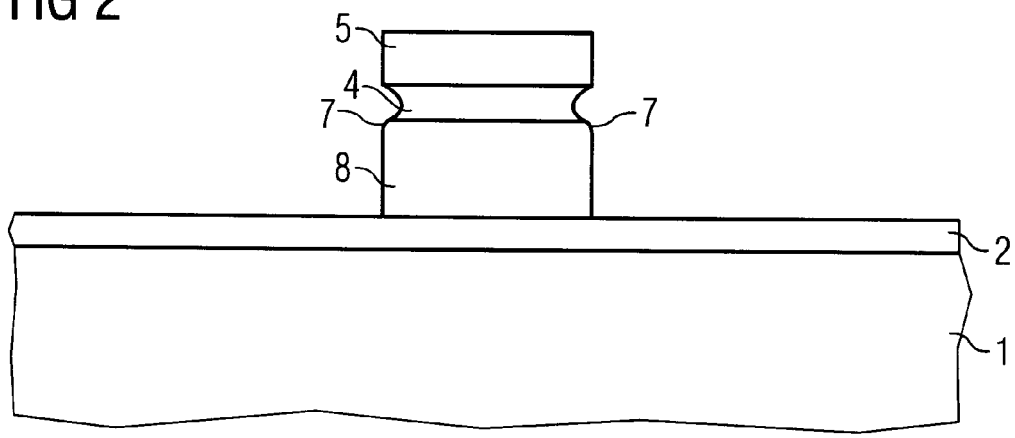
FIG. 2 shows a cross section in accordance with FIG. 1 after the etching of the polysilicon electrode with rounded edges.

FIG. 2 shows the cross section corresponding to FIG. 1 after the etching process by which the polysilicon layer is patterned to form the polysilicon electrode 8. It can clearly be discerned in FIG. 2 that, on account of the lateral hollowed-out recesses of the auxiliary layer 4, an etching attack has taken place at the upper edges of the polysilicon electrode 8 produced, as a result of which the rounded edges 7 have been formed.

In principle, a wet-chemical etching process, a dry etching process or a thermal process is possible as the etching process. RIE (reactive ion etching) is preferred, during which a chemical attack of the etchant takes place at those locations of the auxiliary layer 4 at which owing to the lateral hollowed-out recesses 6 present, the auxiliary layer 4 only thinly covers the polysilicon layer 3 or no longer covers it at all. Said etching attack suffices to produce the desired edge rounding.

One particular advantage of this process is that only one further process step follows the photolithography and patterning of the resist mask in order to produce the lateral hollowed-out recesses in the auxiliary layer 4, without having to modify the subsequent etching step relative to a standard process. This results in an exact patterning of the polysilicon electrode 8 with the envisaged dimensions designed by the resist mask 5, the desired rounding of the edges additionally being achieved without alteration of the lateral dimensions of the polysilicon electrode 8. A base layer 2, if present as illustrated in the figures, may function as an etching stop layer during the etching of the polysilicon layer 3.

The scope of protection of the invention is not limited to the examples given hereinabove. The invention is embodied in each novel characteristic and each combination of characteristics, which includes every combination of any features which are stated in the claims, even if this feature or combination of features is not explicitly stated in the examples.

The invention claimed is:

1. A process for producing polysilicon electrodes on semiconductor components, comprising the steps of:
    (a) applying a polysilicon layer on a top side of a substrate;
    (b) applying an auxiliary layer to the polysilicon layer;
    (c) applying a layer made of photoresist to the auxiliary layer, and patterning the photoresist layer to form a resist mask;
    (d) patterning the auxiliary layer in a manner corresponding to the lateral dimensions of the resist mask;
    (e) providing the auxiliary layer with lateral hollowed-out recesses; and
    (f) after step (e), etching the polysilicon layer using the resist mask and the patterned auxiliary layer in order to form a polysilicon electrode having rounded edges,
    wherein the auxiliary layer is BARC WIDE 15 antireflection layer material and a hot plate temperature of 172° C. to 178° C. is set.

2. The process as claimed in claim 1, wherein the auxiliary layer is produced with a thickness of at most 120 nm.

3. The process as claimed in claim 2, wherein the auxiliary layer is produced with a thickness of 70 nm to 80 nm.

4. The process as claimed in claim 1, wherein the polysilicon layer is produced with a thickness of 100 nm to 400 nm.

* * * * *